United States Patent [19]
Rolfe et al.

[11] Patent Number: 5,209,786
[45] Date of Patent: May 11, 1993

[54] INTEGRITY-ENHANCED THERMOELECTRICS

[75] Inventors: Jonathan L. Rolfe, North Easton; John S. Beaty, Belmont, both of Mass.

[73] Assignee: Thermo Electron Technologies Corporation, Waltham, Mass.

[21] Appl. No.: 594,850

[22] Filed: Oct. 9, 1990

[51] Int. Cl.$^5$ .............................. H01L 35/28
[52] U.S. Cl. ................... 136/211; 136/212; 136/225; 136/232
[58] Field of Search .............. 136/211, 212, 225, 232

[56] References Cited

U.S. PATENT DOCUMENTS

| | | | |
|---|---|---|---|
| 2,997,514 | 8/1961 | Roeder | 136/4 |
| 3,713,899 | 1/1973 | Sebestyen | 136/233 |
| 4,032,363 | 6/1977 | Raag | 136/211 |
| 4,091,673 | 5/1978 | Tamura et al. | 75/351 |
| 4,419,023 | 12/1983 | Hager, Jr. | 374/179 |
| 4,567,365 | 1/1986 | Degenne | 250/338 |
| 4,614,443 | 9/1986 | Hamert | 374/163 |
| 4,687,879 | 8/1987 | Hendricks | 136/212 |
| 4,907,060 | 3/1990 | Nelson et al. | 357/87 X |
| 5,051,275 | 9/1991 | Wong | 357/72 X |
| 5,057,903 | 10/1991 | Olla | 357/72 |

FOREIGN PATENT DOCUMENTS 0122121 4/1984 European Pat. Off. ............... 35/32

*Primary Examiner*—Peter A. Nelson
*Attorney, Agent, or Firm*—Lorusso & Loud

[57] ABSTRACT

Disclosed are integrity-enhanced thermoelectric devices and methods of their preparation. Such devices have the following characteristics: (1) there is, on average, no greater than about 10% incidence of function loss (failure) of the device on application to the device of a substantial impact or distortion force or corrosion exposure, and (2) the device have at least about 85% of the thermal performance of thermoelectric devices without integrity enhancement (i.e., thermal conductivity across the integrity-enhanced devices is significantly less than 0.0021 Cal-Cm/Cm$^2$ Sec °C., and is less than or equal to about 0.0015 Cal-Cm/Cm$^2$ Sec °C.; empirically expressed as maintenance of at least a 40° C. temperature differential over the intra-plate distance which is about 3/16 to about ¼ of an inch.). Integrity enhancement techniques are described, including the method of embedding components of standard thermoelectric devices in syntactic foam materials, such as those formed of resins and balloon elements.

13 Claims, 9 Drawing Sheets

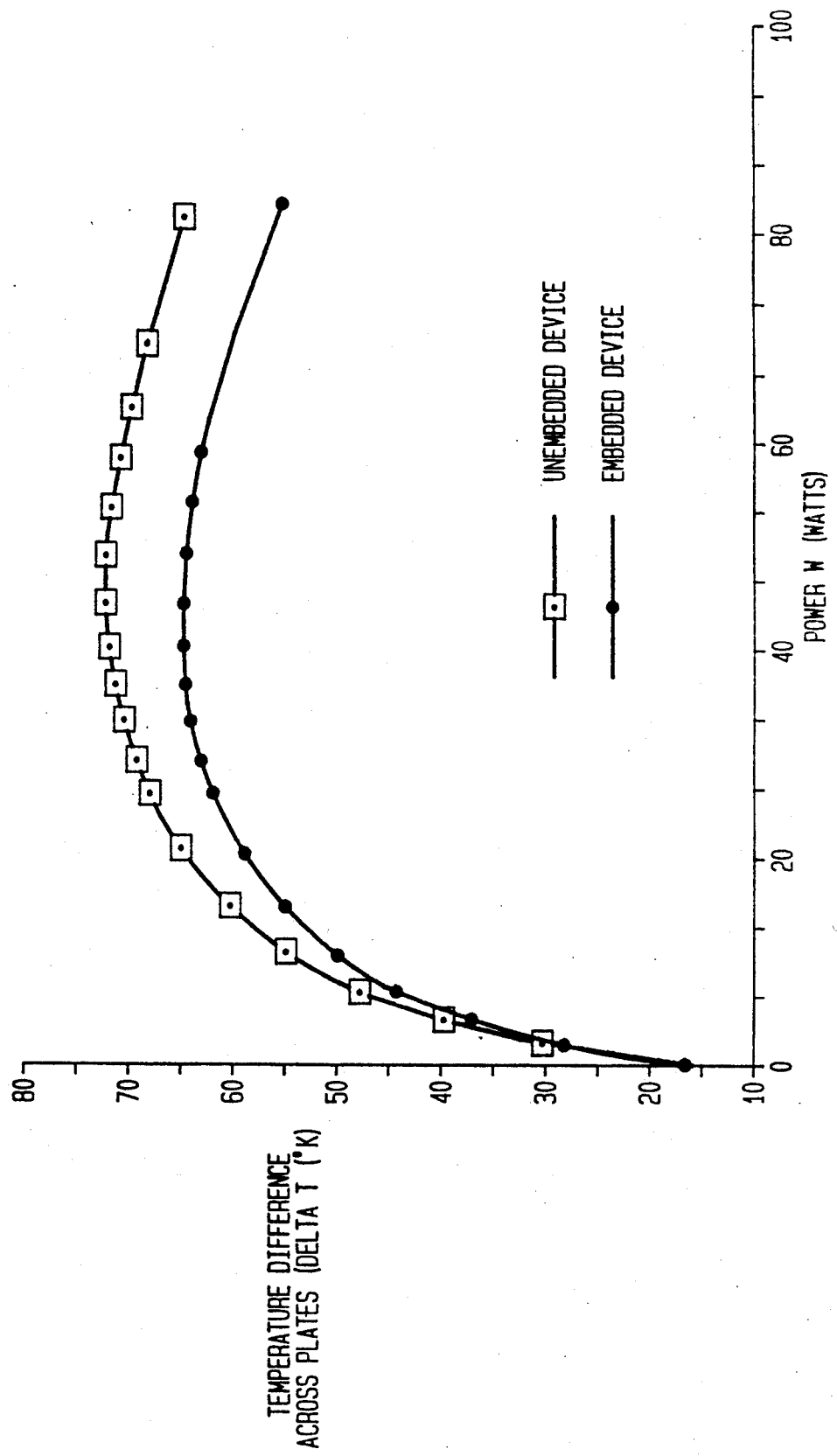

INTEGRITY-ENHANCED THERMOELECTRICS

FIELD OF THE INVENTION

This invention is directed to integrity-enhanced thermoelectric devices and methods of preparation thereof. In particular, it concerns thermoelectric devices enhanced to have the following characteristics: (1) there is, on average, no greater than about 10% incidence of function loss (failure) of the device on application to the device of a substantial impact or distortion force or corrosion exposure, and (2) the devices have at least about 85% of the thermal performance of thermoelectric devices without integrity enhancement.

BACKGROUND OF THE INVENTION

Thermoelectric devices for generating electric power from heat or for providing heating or cooling upon application of electricity are well known. Thermoelectric devices are typically formed from an array of small prisms or dies of alternating p-doped and n-doped bismuth telluride (BiTe), silicon-germanium alloy or other polycrystalline semiconductor materials connected in series by electrical connection (i.e., soldering) to metallized pads bonded to thin ceramic plates (e.g., aluminum oxide or beryllium oxide plates about 1 mm thick). Silicon-germanium alloys are particularly useful at higher temperatures such as about the 600° C.-1000° C. range.

Thermoelectric devices are attractive in many applications because of their absence of moving parts, their small size and low weight. Limitations on the use of such devices arise from their relative fragility and susceptibility to degradation in particular chemical environments, specifically corrosive environments. For example, electrical connections in thermoelectric devices can fail as a result of mechanical or temperature shock or degradation as a result of the operating environment (e.g., corrosive chemicals). A single electrical connection failure can disable an entire thermoelectric device. A frequent source of failure is the differential movement of the ceramic plates on impact or acceleration or bending. Stress from such movement or other forces can result in failure at the solder joints or the nickel barrier layer. The nickel barrier layer is at each end of a die and to which solder bonds. The nickel barrier layer prevents poisoning of the die with solder ions.

Individual parts of thermoelectric devices may also be fragile. The dies are brittle and prone to destruction from vibration, flexure and other factors. Due to the variety of materials employed in the several components of a thermoelectric device, different coefficients of expansion can cause bowing, fracture and ultimately failure. In particular embodiments thermoelectric devices are built as multiple stage units having one thermoelectric stage stacked upon another thermoelectric stage to form a unitary thermoelectric device. Due to size and temperature differentials, the multiple stage or stacked arrays are particularly prone to such damage.

In addition to failure, partial fracture can result in exfoliation of particles which contaminate systems in which thermoelectric devices are installed. Another source of failure is operation of a device in a corrosive or chemically destructive environment such as ferric chloride solution or salt spray etc. A conventional thermoelectric device is exquisitely sensitive to corrosion by exposure to ferric chloride and will be destroyed in about eight hours (un-powered) or about 2 hours (powered) as a result of the metallized pads being dissolved with the formation of replacement compounds on the dies.

Efficiency of a thermoelectric device is limited by heat "leakage" across the device nullifying or counteracting the heat differential driving, or being established by, the device. It is rarely possible to maintain a temperature differential greater than about 65° or 70° C. across the plates of a thermoelectric device. In multi-stage thermoelectric devices, each successive stage will not produce such a large temperature differential, but the individual stages, if driven separately, will do so.

Embedding electrical devices in polymers and other substances is known. However, the prior art, in general, teaches the embedding of electrical devices only in materials which have relatively high thermal conductivity so as to be able to dissipate heat. Surprisingly, the thermoelectric devices of the present invention, due to the incorporation or embedding therein of syntactic foam (providing "kinematic association" as described below) are superior as to shock resistance, yet have little loss as to increased heat leakage—less than about 15% when an integrity-enhanced device is driven at or near maximum and much less when driven below maximum. Moreover, the integrity-enhanced thermoelectric devices are resistant to corrosive attack.

It is an object of this invention to provide a thermoelectric device resistant to impact, distortion and corrosion, yet having high thermal integrity.

It is another object of this invention to provide an integrity-enhanced thermoelectric device with rapid slew rate.

SUMMARY OF THE INVENTION

This invention includes an integrity-enhanced thermoelectric device. In particular embodiments the device comprises two or more dies or two or more stage units. In particular embodiments, such a device comprises at least two thermoelectric dies or thermocouples (such as bismuth telluride), which are electrically connected at each of their respective ends to a conductive pad bonded to a ceramic plate, and wherein the dies and conductive pads are embedded in a syntactic foam in kinematic association. This type of device may include two or more stage units. The syntactic foam may comprise a resin such as epoxies, polyurethane, urea-formaldhyde, silicone or fluorosilicone as well as hollow glass spheres. Preferred glass spheres are from about 10 to 250μ in diameter. Plates of the device include alumina ceramic plates. A preferred syntactic foam comprises epoxy resin having glass balloons in a ratio of about 70:30 (by weight).

In a specific embodiment of the integrity-enhanced device thermal conductivity across the device is equal to or less than about 0.0010 Cal-Cm/Cm$^2$ Sec °C., and preferably equal to or less than about 0.0005 Cal-Cm/Cm$^2$ Sec °C. Similarly, in a specific embodiment of the integrity-enhanced device an empirical temperature differential is equal to or greater than about 50° C., and preferably equal to or greater than about 60° C.

In particular embodiments of the invention there is, on average, no greater than about a 10% (and preferably no greater than about 5% and most preferably no greater than about 1%) incidence of function loss on impact of 30 G (i.e., in testing a statistically significant number of units), and preferably, no greater than about a 10% (and preferably no greater than about 5% and most preferably no greater than about 1%) incidence of function loss on 3-axis random vibration of about 5 minutes duration, of about 30 DB/octave, 0.04 $G^2$/Hz from 20–2,000 Hz.

The invention includes integrity-enhanced thermoelectric devices having a slew rate of at least about 15° C./min, and preferably, a slew rate of at least about 40° C./min, and more preferably a slew rate of at least about 40° C./20 sec.

Embodiments of the invention include an integrity-enhanced thermoelectric device having syntactic foam of a density equal to or less than about 0.88 gm/cc and a rigidity of at least about 1 to 2 kg/meter/100 $cm^2$, and preferably, density equal to or less than about 0.44 gm/cc.

This invention further comprises a method of integrity enhancing a thermoelectric device comprising embedding in kinematic association said device in syntactic foam to produce an integrity-enhanced thermoelectric device. The method includes embedding by injection of syntactic foam under pressure, which in one embodiment is at a pressure of least about 5 psi. A convenient viscosity of syntactic foam (prior to curing) for embedding is from about 1,000 to about 20,000 Cps. In one embodiment, the cured foam has a Shore hardness of at least about Shore D45. The method results in a device wherein thermal conductivity across the resulting device is equal to or less than about 0.0010 Cal-Cm/$Cm^2$ Sec °C., and preferably, equal to or less than about 0.0005 Cal-Cm/$Cm^2$ Sec °C. Otherwise expressed, the method results in a device wherein empirical temperature differential of the resulting thermoelectric device is equal to or greater than about 50° C., and preferably equal to or greater than about 60° C. In a particular embodiment the method results in a device comprising at least two thermoelectric dies each end of which is electrically connected to a conductive pad bonded to a ceramic plate, wherein the dies and conductive pad are embedded in a syntactic foam in kinematic association. In specific embodiments, the method entails syntactic foam with hollow glass spheres, preferably from about 10 to 250μ in diameter. In particular, the method comprises embedding a plurality of bismuth telluride thermocouples and alumina ceramic plates in syntactic foam of epoxy resin and glass balloons said resin and balloons in a ratio of about 70:30 (by weight).

In a specific embodiment this invention includes an integrity-enhanced thermoelectric device comprising:

a first plate and a second plate spaced apart from each other;

a couple including a p-doped leg and an n-doped leg, and means for electrically interconnecting a first end of said p-doped leg to a first end of said n-doped leg;

means for connecting opposite ends of said p-doped leg and of said n-doped leg to said plates;

said plates and said legs defining an interspace between said plates; and, syntactic foam occupying said interspace and in kinematic association with said legs and plates to form an embedded thermoelectric device. In a preferred embodiment of this device the plates are formed of ceramic material and the means for electrically connecting a p-doped leg to an n-doped leg includes a metal pad bonded to the surface of the plate defining the interspace and to the first end of said p-doped leg and the first end of said n-doped leg. In this embodiment the syntactic foam may comprise epoxy resin and also comprise hollow glass spheres. Preferably, the device further includes at least two of the couples electrically connected in series and having opposed ends connected to the plates. Such an embodiment may also comprise a syntactic foam of a vitreous material and/or sintered ceramic or glass micro-balloons and the resulting device will be ultra-corrosion exposure resistant. Another particular integrity-enhanced thermoelectric device of this invention is:

a first plate and a second plate spaced apart from each other;

a couple including a p-doped leg and an n-doped leg, and means for electrically interconnecting a first end of said p-doped leg to a first end of said n-doped leg;

means for connecting opposite ends of said p-doped leg and of said n-doped leg to said plates;

said plates and said legs defining an interspace between said plates; and, syntactic foam upon curing occupying said interspace with said legs and plates to form an embedded thermoelectric device, such that: as to the formed device;

(i) there is, on average, no greater than about 10% incidence of function loss (failure) of the device on impact or distortion force of acceleration forces of up to about 20 G; or 3-axis random vibration of about 5 minutes, 30 DB/octave, 0.04 $G^2$/Hz from 20–2,000 Hz; or bending forces in the 1–2 Kg/linear meter range; and, (ii) in an oxidizing or reducing environment (other than resin dissolving environment) sufficient to render an unembedded device inoperative in hours or days, said embedded device operates in such an environment at least 50 times longer than an unembedded device; and, (iii) the device has thermal conductivity across the device significantly less than 0.0021 Cal-Cm/$Cm^2$ Sec °C. being about equal to or less than 0.0015 Cal-Cm/$Cm^2$ Sec °C.;

(iv) said syntactic foam comprises has not shrunk upon curing;

(v) said foam upon curing is associated or bonded with said legs and plates to resist substantial impact or distortion force while maintaining at least about 85% thermal performance and said foam upon curing occupies at least a majority of the interspace; and, wherein said foam before curing has a viscosity at 65°–70° F. (room or ambient temperature) of from about 2,000 to 20,000 Centipoise being readily flowable at applied pressures of about 5 psi or greater.

In a preferred embodiment, the syntactic foam comprises a resin and glass balloons, the balloons being from about 45 to about 250μ diameter and comprising about (30%) by weight of the mixture of balloons and resin. The more preferred such devices have a slew rate of at least about 15° C./minute, and more preferably a slew rate of at least about 40° C./minute, and still more preferably a slew rate of at least about 40° C./20 seconds, and yet more preferably a slew rate of at least about 40° C./10 seconds.

BRIEF DESCRIPTION OF THE FIGURES

FIG. 4 is a graph of data plotted as temperature difference (delta T) versus applied power in watts for integrity-enhanced and unenhanced thermoelectric devices.

DETAILED DESCRIPTION OF PREFERRED EMBODIMENTS OF THE INVENTION

Figure 1:
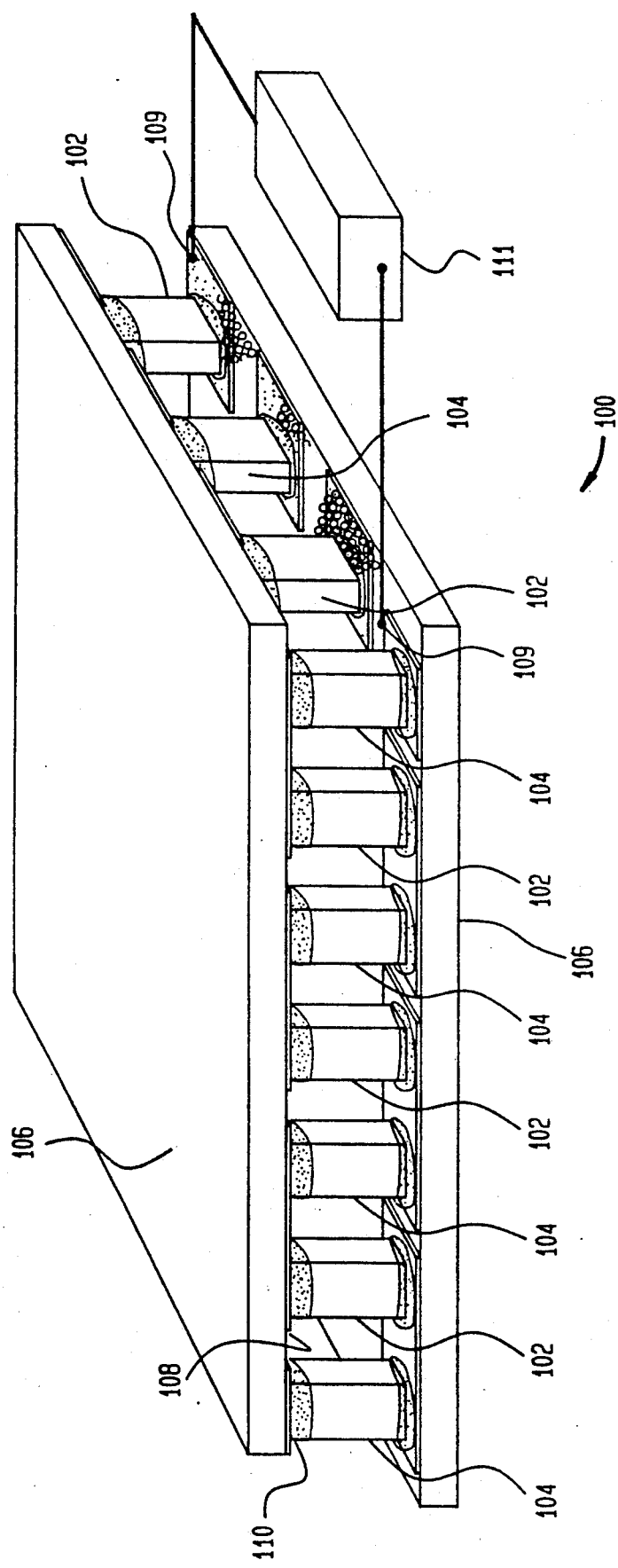
FIG. 1 is a diagrammatic representation in perspective of a type of thermoelectric device currently available.

This invention will be more clearly understood in reference to certain terms specifically defined as follows:

"Integrity-enhanced" in reference to thermoelectric devices means that two conditions obtain: (1) there is, on average, no greater than about 10% (and preferably no greater than about 5% and most preferably no greater than about 1%) incidence of function loss (failure) of the devices on substantial impact or distortion force or corrosive exposure, and (2) the devices have at least about 85% and preferably 90% of the thermal performance of unembedded thermoelectric devices. Reference to a failure limitation as "on average" refers to total failure of a device occurring in the stated percentage of instances in a statistically significant number of tests.

"Substantial" as determining impact and distortion force means acceleration forces of about 20 G; or 3-axis random vibration of about 5 minutes duration, 30 DB/octave, 0.04 G$^2$/Hz from 20–2,000 Hz.

"Corrosive exposure" refers to environments sufficient to render an unembedded device inoperative within a period of hours or days at most, usually oxidizing or reducing environments. Excluded, except where specifically noted, are resin dissolving materials such as phenol/methylene chloride. However even as to "ultra-corrosive exposure" such as resin dissolving materials, with syntactic foam made of a non-resin material such as sintered ceramic microballoons in a vitreous matrix the thermoelectric device will remain operative and thus integrity-enhanced. A device integrity-enhanced operates in such a corrosive environment at least about 50 times longer than an unembedded device. It will be appreciated that the wide range of corrosive environments requires selection of particular syntactic foams (and ancillary electrical connector protectant if required) for maximum protection in view of anticipated mechanical stress, temperature range of operation and cost factors. Based upon the teachings herein the selection of resin as to corrosive exposure resistance will be clear to those skilled in the art. Based upon the teachings herein the selection of other syntactic foam materials as to corrosive/ultra-corrosive exposure resistance will be clear to those skilled in the art.

"Maintained thermal integrity" means thermal conductivity across the device significantly less than 0.0021 Cal-Cm/Cm$^2$ Sec °C., preferably equal to or less than about 0.0015 Cal-Cm/Cm$^2$ Sec °C. so that the device has a thermal performance (temperature difference across the plates) at least about 85% of the device without integrity enhancement when driven at maximum normal operating power. A driven thermoelectric device is one operated by either an electric current or heating to generate an electric current. The "maximum" reflects the peak heat or electrical load that does not reduce efficiency, and is easily empirically determined by comparing output efficiency with input energy. Note that maintained thermal integrity may also be empirically expressed as the maintenance of a temperature difference over the intra-plate distance (which is typically about 3/16 to about ¼ of an inch) of equal to or greater than about 40° C. ("empirical temperature differential"). In a preferred embodiment thermal conductivity is equal to or less than about 0.0010 Cal-Cm/Cm$^2$ Sec °C., and more preferably equal to or less than about 0.0005 Cal-Cm/Cm$^2$ Sec °C.

"Thermoelectric device" means a heat-to-power transducing device of p- and n-doped semiconductors. In one embodiment a thermoelectric device comprises two or more small prisms or legs (commonly called "dies"), often of square or rectangular cross-section, of alternating n-doped and p-doped bismuth telluride. Dies in multiples (termed "couples") are electrically connected in series by affixation to conductive pads bonded to ceramic plates. Other embodiments employ dies of bismuth telluride/selenide or silicon-germanium alloys or solid solutions or other admixtures known in the art. These semiconductors are more widely discussed in *Modern Thermoelectrics*, D. M. Rowe and C. M. Bhandari (Holt, Reinhart and Winston, London) (1983), the disclosure of which is herein incorporated by reference. In many instances of commercial use a thermoelectric device will have dies or legs arranged in 6 or more series junctions designed for providing heating or cooling when electric power is applied to the interconnected legs or for transducing units of heat to units of current. A particular arrangement of a thermoelectric device is the "unijunction" comprising two dies connected to a ceramic plate and in electrical connection at only one end. As used herein, thermoelectric device is understood to be distinct from and exclusive of bimetal thermocouple devices or arrays which are characterized in operating at millivolts and milliamperes or below and whose uses are typically limited to instrumentation such as temperature measurement. Thermoelectric devices of the present invention operate at greater than about 0.5 volts and greater than about 0.25 amperes. Further distinguishing thermoelectric devices as referred to herein from bimetal devices is the high thermal conductivity associated with bimetal devices. Bimetal devices have a thermal conductivity of at least about 0.058 Cal-Cm/Cm$^2$Sec °C. (e.g., constantan alloy) and thermoelectric devices as referred to herein have a thermal conductivity no greater than about 0.017 Cal-Cm/Cm$^2$Sec °C.—bimetal thermal conductivity is over 3 time higher than thermoelectric devices.

"Syntactic foam" means (i) a foam or solid polymer or other material having a thermal conductivity of no more than about than 0.0015 Cal-Cm/Cm$^2$ Sec °C. and preferably less than 0.0010 Cal-Cm/Cm$^2$ Sec °C. and most preferably 0.0005 Cal-Cm/Cm$^2$ Sec °C. or less (or, empirically, will maintain a temperature differential of at least about 40° C. over a thickness of about 3/16 to about ¼ of an inch), and (ii) hardness of the cured foam of a Shore hardness of Shore D63 or harder. A preferred quality of the syntactic foam employed in the integrity-enhanced thermoelectric devices of the present invention is a dielectric strength of at least 600 V/mil and preferably 1000 V/mil or greater. In one embodiment, the above mentioned parameters are achieved by selection of ingredients employed in foam forming—e.g., resin and balloon elements. Hardness and thermal insulating and dielectric strength are easily determined by methods known to those skilled in the art. Nonshrinking during curing is an important characteristic of suitable syntactic foams. Shrinking during curing is a characteristic of solvent associated resins. It is important to note the expansive nature of the term foam to include materials other than polymers and resins. Specific reference is made to high temperature materials that are stable well above the useful temperature of most polymers. Such materials include vitreous frits or ceramics, including sintered ceramics with the above noted thermal and hardness characteristics. Microballoons for such foams may be made of suitable high temperature material such as alumina ceramic material. In particular embodiments such as those requiring high temperature resistance and liquid impermeability, ceramic microballoons in a vitreous ceramic matrix are employed. Those skilled in the art will understand that sintered in place foam will be used with high temperature tolerant dies such as silicon-germanium. Alternatively sintering can be performed separately and the sintered foam fitted to the dies.

"Kinematic association" means the association or bonding of cured or sintered or otherwise hardened foam with other thermoelectric device elements to resist substantial impact or distortion force while maintaining at least about 85% thermal performance. Kinematic association also provides a barrier to corrosive environments, except in the particular case of a sintered ceramic or glass microballoon type frit and not in a resin or vitreous matrix. In kinematic association the foam occupies at least a majority of the intra-device void volume, and preferably at least about 85% void volume and most preferably about 95% or more. In particular, the foam is in contact with the structural elements (i.e., dies, upper and the lower plates) of the thermoelectric device. Foam that shrinks substantially upon curing will not be in kinematic association and may induce residual strain. Without being bound by any particular theory it is believed that a major protective mode of kinematic association is the even distribution of force throughout an embedded device. Typically, in an acceleration stress an unembedded device will experience lateral movement of one plate, an unsupported plate, relative to another of its plates which is typically mounted to a fixed surface. This differential acceleration leads to a hinging action at the die/plate interface and failure. Kinematic association enhances integrity in distributing acceleration force evenly or, similarly, in resisting and distributing torsion or vibration.

"Slew Rate" means the change in temperature per unit time (e.g., °C./Sec) of the driven plate of a thermoelectric device. Quick adjustment of plate temperature, a desireable characteristic of thermoelectric devices in particular applications, is retarded by the mass of the embedding material. In certain applications a slew rate of 15° C./minute is considered fast, and would be well beyond the response for thermoelectric devices having solid resins as embedding material. In particular embodiments of the present invention a large volume of balloon material in the embedding syntactic foam substantially reduces its mass, permitting rapid temperature adjustment of the driven plate. This permits adjustment or slew on the order of a 40° C. change in less than about 20 seconds, or more preferably, in less than about 10 seconds. Solid resins could not approach such a rapid slew rate.

Preferred integrity-enhanced thermoelectric devices maintain temperature differentials between plates of at least about 50° C. and more preferably at least about 60° C.

A preferred syntactic foam for the integrity-enhanced devices of the invention has low thermal conductivity, high dielectric and mechanical strength and good adhesion to the other materials of the thermoelectric device. The syntactic foam, prior to polymerization or sintering, should have fluid-like properties suitable for its entry into the interstitial spaces of the thermoelectric device—generally low enough shear and viscosity to readily permit injection.

A resin suitable for use in making syntactic foam exhibiting appropriate characteristics is a low thermal conductivity epoxy resin such as F110 TM to (available from Tra-Con, Inc. of Medford Mass., U.S.A.). To prepare a syntactic foam, resin is mixed with a substance such as microballoons of glass, phenolic resin, high alumina ceramics or other electrically and thermally nonconductive corrosion resistant material available from a number of sources (e.g., Emersom & Cuming, Inc. Canton Mass., U.S.A.; 3M, Minneapolis Minn.). Depending on the thermal properties of the matrix material of the syntactic foam, such as the selected resin, varying amounts of balloon material is required to result in suitable thermal properties of the resulting syntactic foam. The resulting thermal properties are easily determined by calorimetry. (Similarly the dielectric strength is determined by appropriate metering, as by a high voltage ohmmeter.) If F110 is employed as a resin, glass balloons of 45 to 250$\mu$ diameter and comprising about thirty percent (30%) by weight of the mixture of balloons and resin have been found to be effective. At these proportions of resin and balloons, the uncured foam has a viscosity at 65°-70° F. (ambient or room temperature) of about 17,000 Centipoise (Cps) and is readily flowable at applied pressures of about 5 psi or greater to fill the inter-die spaces. (Viscosities of from about 1,000 to 20,000 Cps. are useful.) Upon curing, the syntactic foam formed from the above-described resin and balloons exhibits a dielectric strength above 600 V/mil, a hardness of Shore D93+, and a tensile strength of about 2,400 psi. Density of the cured syntactic foam is less than 0.88 gm/cc and preferably from about 0.65 to about 0.75 gm/cc. (Shore hardness of from at least about Shore D45 is suitable.)

Systems based upon resins of less adequate (i.e., higher) thermal conductivity but suitable rigidity can be used with increased amounts of balloon or foam elements. Similarly, systems based upon resins of less than adequate rigidity (e.g., silicon elastomers) can be used with increased amounts of rigid balloon elements. One such resin is urea-formaldehyde. Adhesion of the foam to the dies and other structural elements in such a system may require augmenting with a silane coupler (e.g., for ceramics) or an isocyanate. In such applications the contiguous balloon material may constitute almost the full deminisions of the void volume (e.g., from about 70% up to greater than about 90%) and the matrix material (e.g., elastomer or resin) merely acts to fix the balloon structures in place and provide corrosive environment integrity. Particularly in systems where corrosion resistance or temperature aspects of integrity enhancement are desired, silicon and fluorosilicon elastomers are useful with sufficient rigid element incorporation. High temperature resistant integrity-enhanced thermoelectric devices, in a particular embodiment, have syntactic foam comprised of microballoons of glass or ceramic alumina and a vitreous maitix. Microballoons may be sintered into a single unit, fitted to thermoelectric dies and plates, and vitreous material introduced subsequently.

Microballoons are conveniently formed as gas filled spheres. Inert gases such as helium, argon and neon are preferred, but relatively inactive gases such as nitrogen are also employed in particular applications. Mixtures of gas are also included. Where slew rate considerations are important, less thermal mass and hence faster slew rate is obtained by reduction of the amount of gas or use of gas such as hydrogen, helium or argon is contemplated.

The invention will be better understood with reference to the following description of the figures.

FIG. 1 is a diagrammatic representation of one type of thermoelectric device (100) currently available. The illustrated thermoelectric device comprises an array of n-doped legs or dies (102) and p-doped legs or dies (104) formed of a semiconductor such as bismuth telluride and arranged in three files of seven dies each. Opposed plates or supports (106) of electrically nonconductive material such as alumina or other ceramic are metallized at selected locations on their interior surface (108) with a conductor such as copper 0.0005–0.005 inches thick to form pads which electrically connect one end of each n-doped die (102) to the adjacent end of a p-doped die (104). The end junctions (109) are shown for connection to a drive power source or electrical load (111). Solder junctions (110) join the dies to the metallized pads to connect the p-doped dies to the n-doped dies in series throughout the device.

Figure 1A:
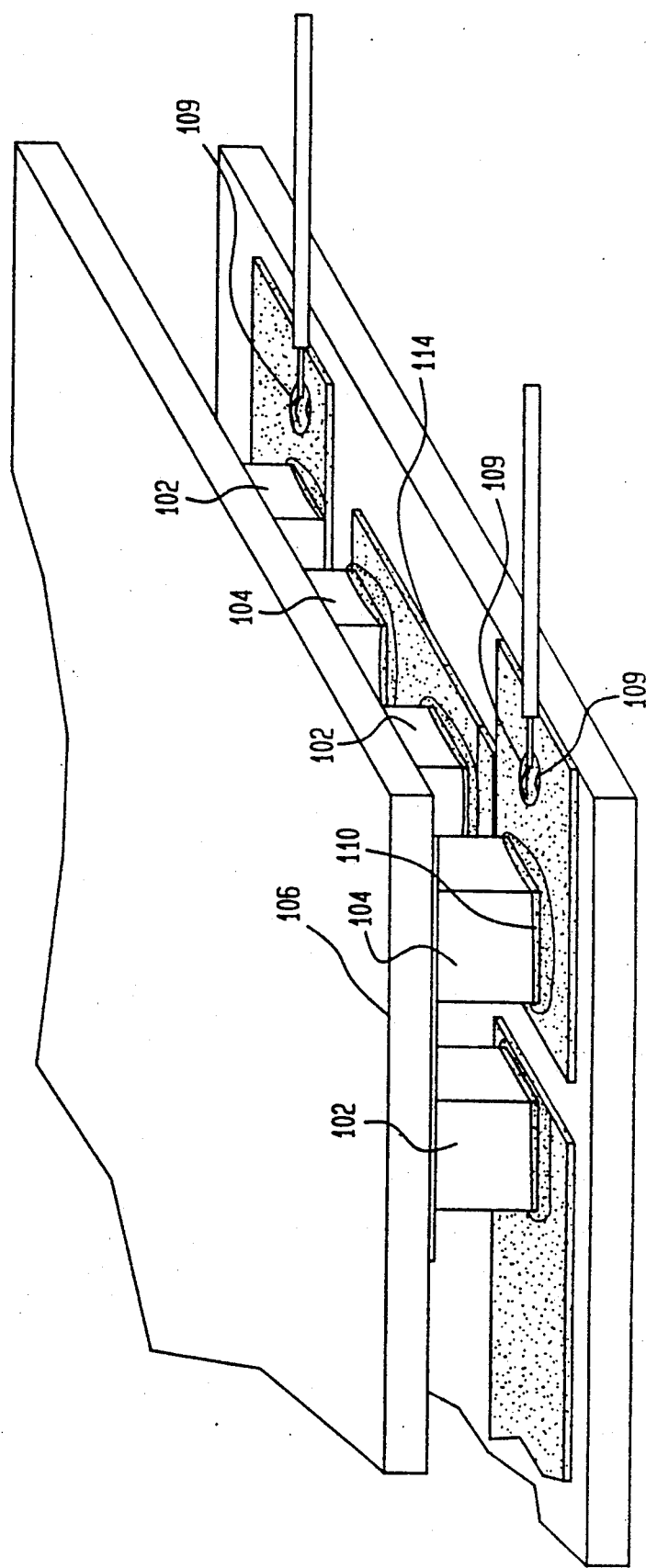
FIG. 1a is a view in perspective of a portion of a thermoelectric device similar to that of of FIG. 1.

FIG. 1a shows the attachment of end junctions (109) to solder junctions (110) and metallized portion (114) in a device similar to that of FIG. 1.

Figure 2A:
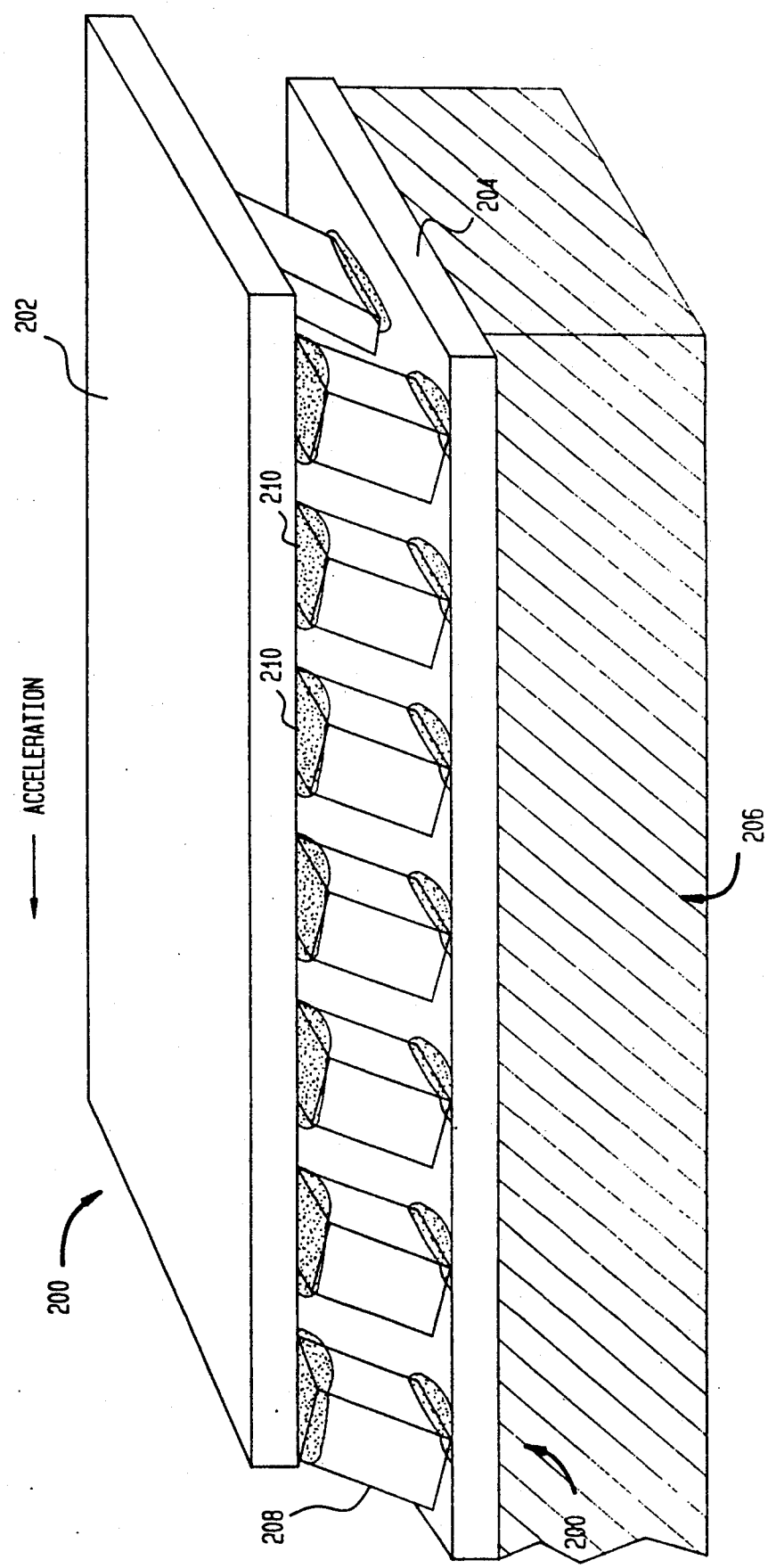
FIG. 2a is a view of a thermoelectric device similar to that of FIG. 1 indicating likely shear failure/fracture points.

FIG. 2a shows a thermoelectric device similar to that of FIG. 1 indicating likely shear failure/fracture points. The thermoelectric device (200) has opposed upper (202) and lower (204) ceramic plates and is fastened to a fixed surface (206) via the lower ceramic plate (204). Upon application of a shearing force, such as acceleration of the surface (206) in one direction, the lower ceramic plate (204), moves relative to the unsupported upper plate (202). The dies (208) exhibit hinge failure at the solder joints or nickel barriers (210).

Figure 2B:
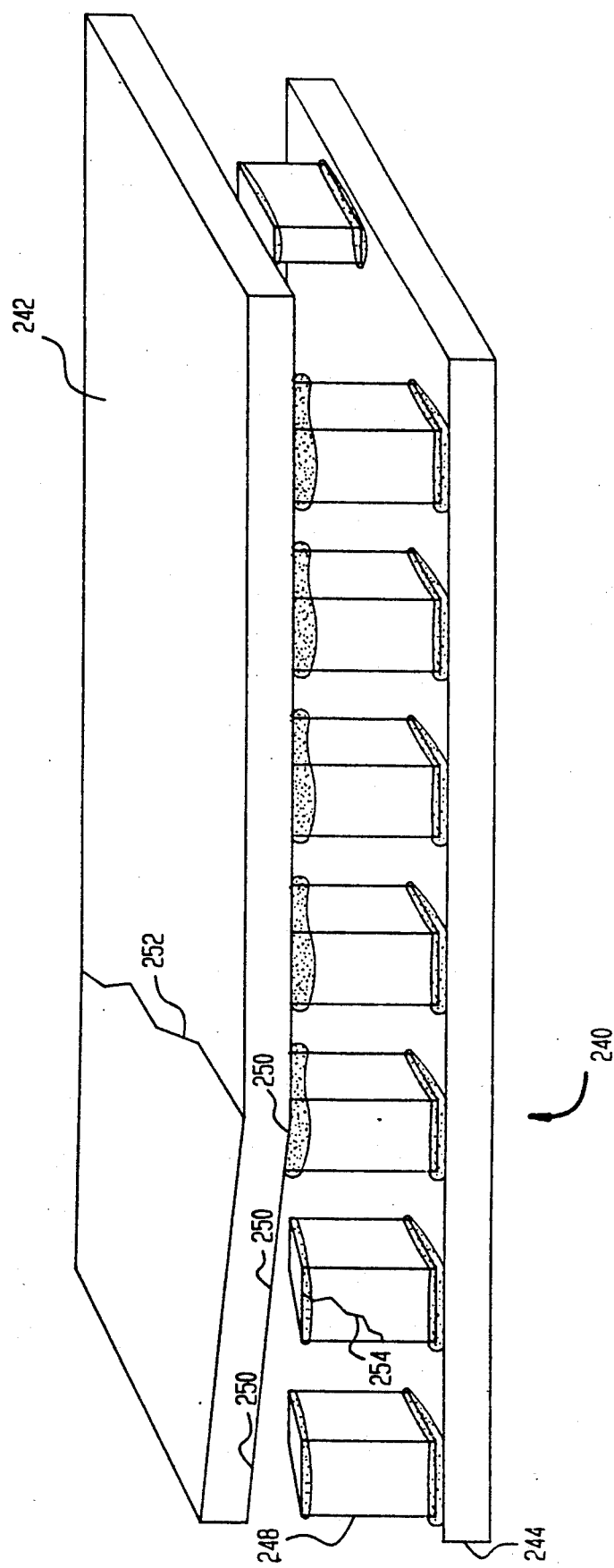
FIG. 2b is a view of a thermoelectric device similar to that of FIG. 1 indicating likely die and tensile failure/fracture points.

FIG. 2b shows a thermoelectric device similar to that of FIG. 1 indicating likely die and tensile failure/fracture points upon forces exerted by thermal bowing or deflection. Here, the thermoelectric device (240) shows flexure of the upper ceramic plate (242) in a direction away from the lower ceramic plate (244). Failure aspects include hinge failure at the solder joint or nickel barrier (250), plate fracture (252) and die fracture (254).

Figure 3:
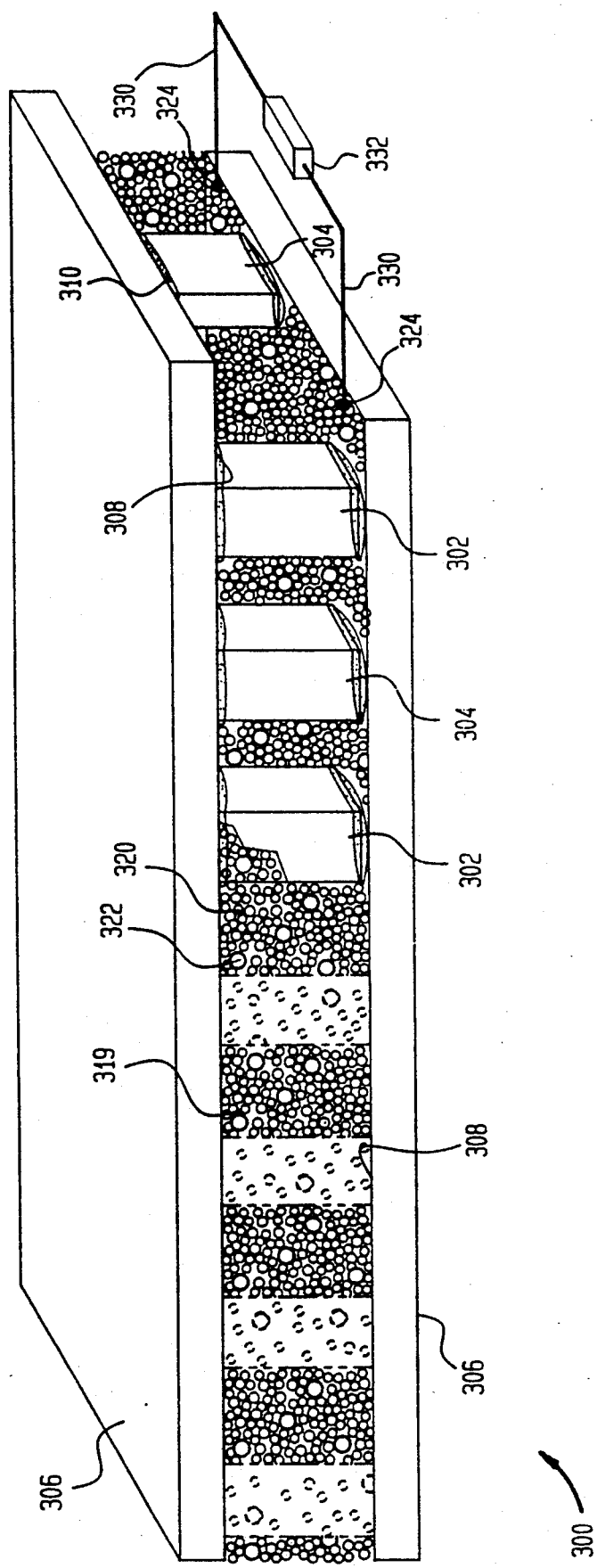
FIG. 3 is a cutaway perspective view of a thermoelectric device disclosed according to a preferred embodiment of the invention.
Figure 3A:
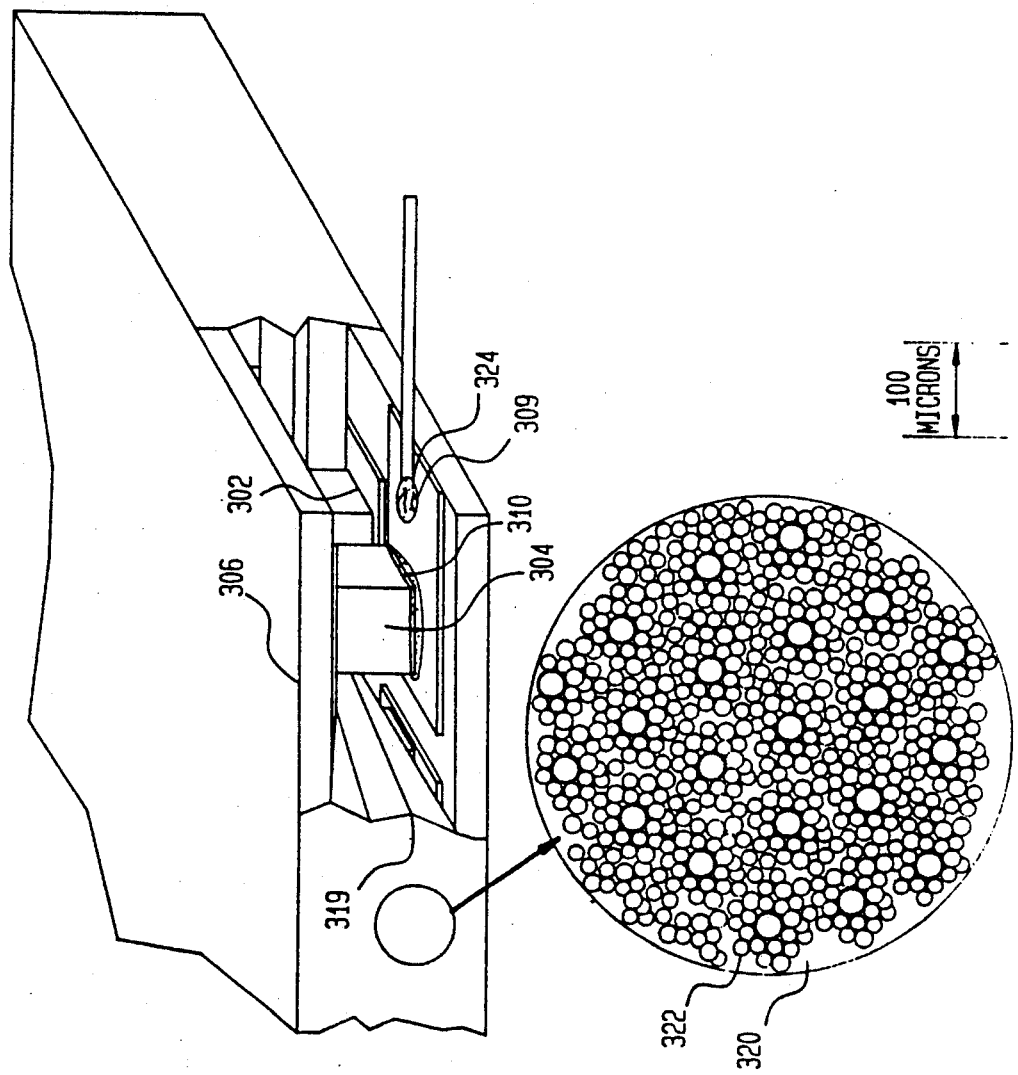
FIG. 3a is a magnified cutaway view of the embedded device of FIG. 3.

FIG. 3 and the cutaway perspective view FIG. 3a illustrate a preferred embodiment of the integrity-enhanced thermoelectric device (300) of the invention. P-doped semiconductor dies (302) (some shown in phantom) and n-doped semiconductor dies (304) (some shown in phantom) formed of a semiconductor material such as bismuth telluride are arranged in three files of seven dies each. Opposed plates or supports (306) of an electrically nonconductive material such as alumina or other ceramic are metallized at selected locations on the plate interior surface (308) with 0.0005–0.005 inch thick copper to form pads (309) which electrically connect one end of each n-doped die (304) to the adjacent end of a p-doped die (302). Solder junctions (310) connect the p-doped dies to the n-doped dies in series through the metallized surfaces. The dies (302) and (304) and interior surfaces (308) are kinematically associated or embedded in a syntactic foam (319) of resin (320) such as epoxy of polyurethane, and balloons (322) such as glass, comprising 30% by weight of the uncured foam. (For convenience in drawing, microballoons are shown substantially enlarged—even as to the scale of the drawing—over the actual size.) In particular embodiments the porportion of foam comprising balloons will vary from none (in instances where the matrix material has sufficient thermal and ridigidity properties) to 100 (in the limiting case of sintered balloons and no matrix material) depending on the required thermal and ridigidity characteristics. The cured syntactic foam has a Shore hardness of at least D63 and the integrity-enhanced thermoelectric device pictured has a thermal conductivity of less than 0.0015 Cal-Cm/Cm$^2$ Sec °C. (or the ability to maintain a temperature differential of at least about 40° C. over an inter-plate separation of about 3/16 to ¼ inch). As in FIG. 1, end junctions (324) are shown leading from solder connections (330) for connection to a drive power source or electrical load (332).

Figure 3B:
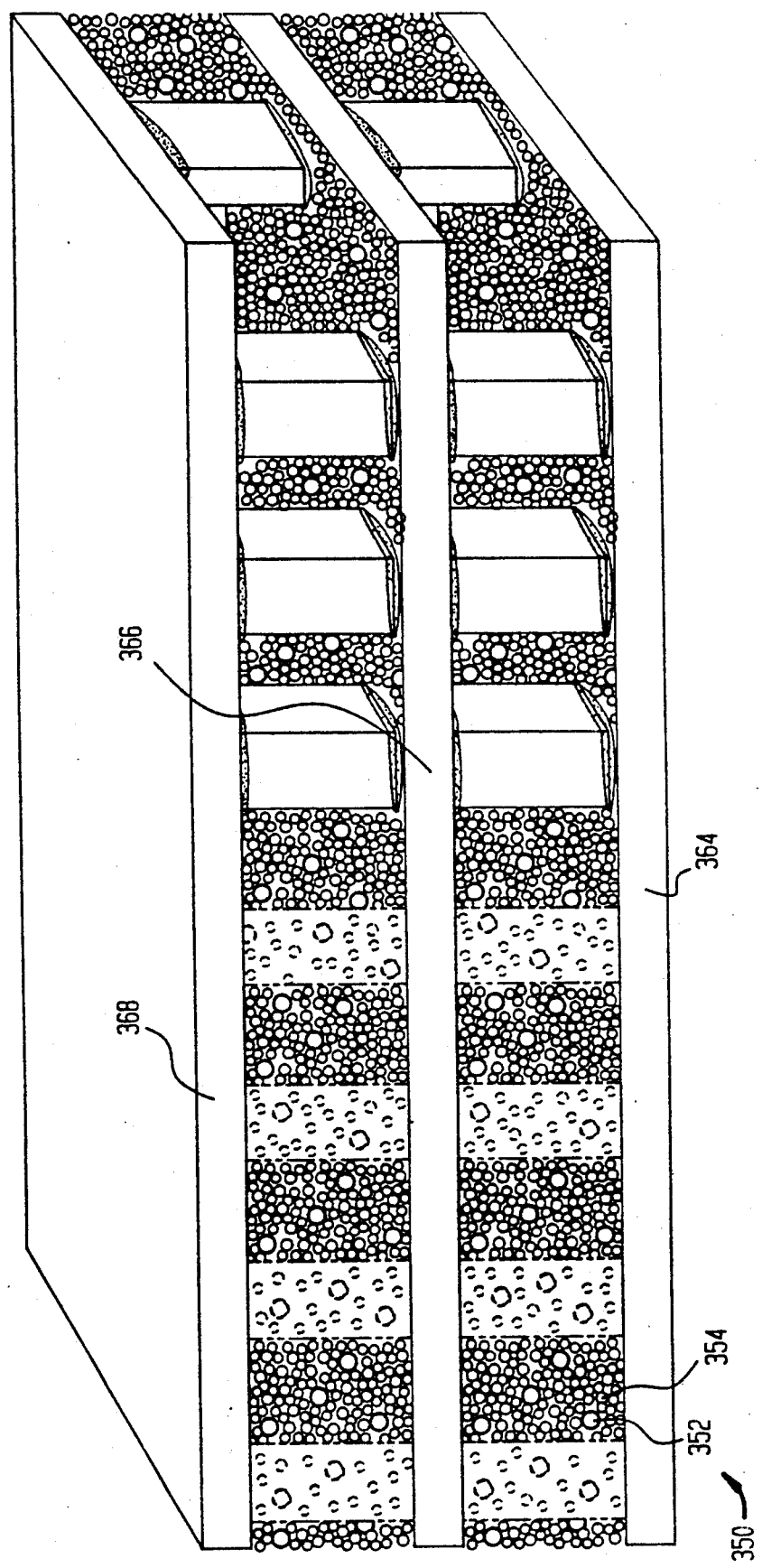
FIG. 3b is a perspective view of a multi-stage or stacked thermoelectric device according to a preferred embodient of the invention.

FIG. 3b is a perspective view of a two-stage or stacked thermoelectric device (350) of the invention showing syntactic foam (352) embedding a thermoelectric device. (For convenience in drawing, microballoons are shown substantially enlarged—even as to the scale of the drawing—over the actual size.) The foam contains a limited amount of resin relative to the large volume of balloons or cells (354). The two stages have electrically-interconnected dies between three plates (364) (366), and (368).

Properties of the integrity-enhanced thermoelectric device are illustrated with reference to Table 1 and 2 which list results of tests conducted on multicouple thermoelectric devices both prior to and following embedding with syntactic foam. The thermoelectric devices tested were 31 couple, 9 amp units measuring 32×32×5 mm, fabricated of 4 rows of 8 alternating p-doped and n-doped BiTe dies connected electrically in series. The individual dies measured 2.5×2.5×3.5 mm. The integrity-enhanced thermoelectric device was embedded in a syntactic foam of 30% by weight borosilicate glass balloons in a matrix of epoxy (F110 TM, Tra-con Inc., Medford, Mass.) injected by syringe with a PFTE mold.

In Tables 1 and 2 the following abbreviations are used:

Th=temperature in degrees Centigrade (°C.) or degrees Kelvin (°K.) of a heat sink constant or reference block maintained in contact with the reference plate of the thermoelectric device.

I=current maintained through the thermoelectric device (in amperes).

V=voltage maintained to drive the thermoelectric device to current, I.

W=power (in watts) employed to drive a thermoelectric device (W=IV).

Tc=temperature of driven plate (in xC or xK, as indicated).

delta t=difference in temperature between reference block and driven plate.

Table 1 shows that, for the test data provided, no degradation in performance resulted from kinematic association or embedding of thermoelectric devices in that delta t of the embedded device remained at the same level as that of the unembedded device at the same levels of applied power.

Figure 5:
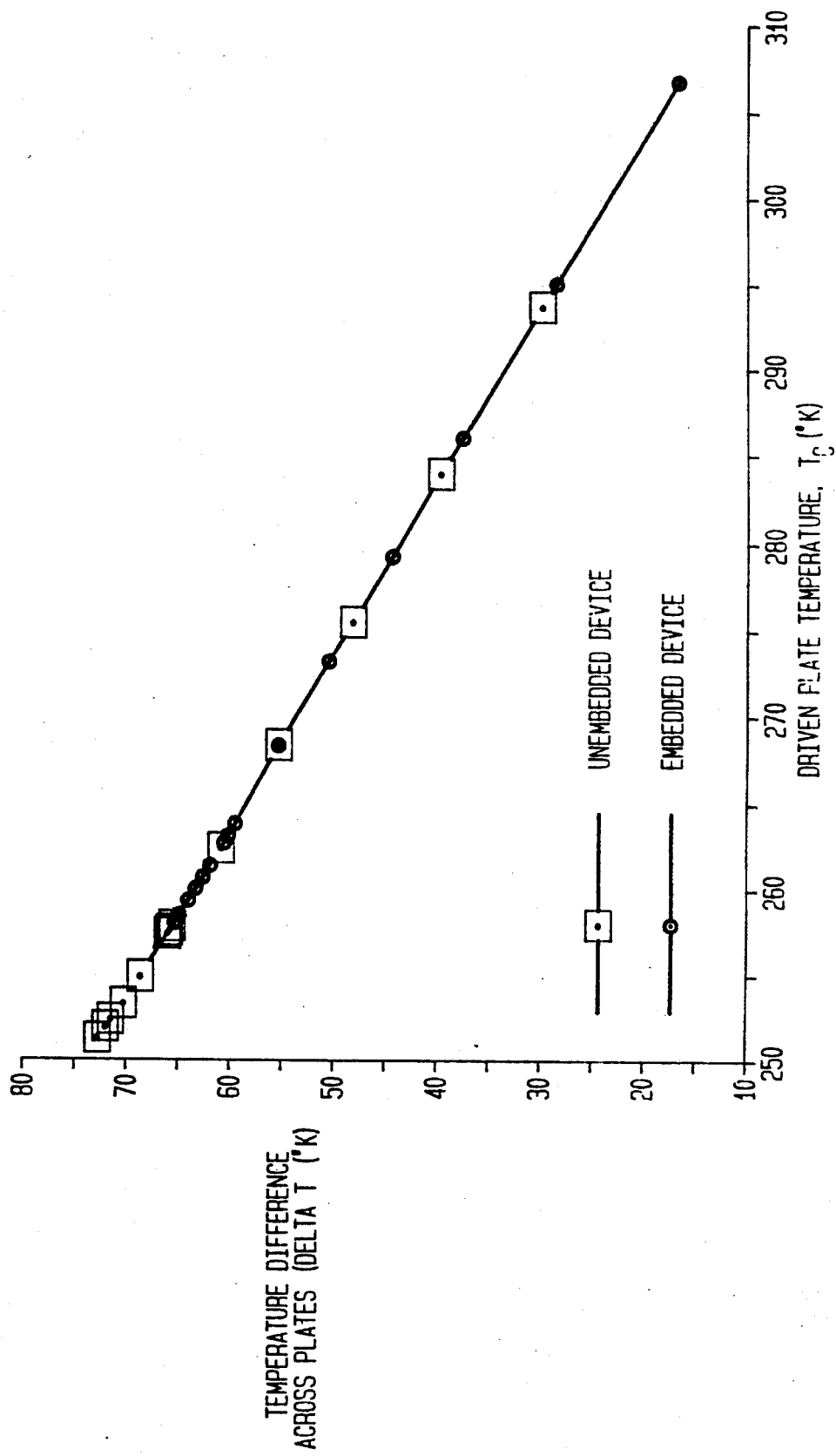
FIG. 5 is a graph of data plotted as temperature difference (delta T) versus temperature of integrity-enhanced and unenhanced thermoelectric devices.

Table 2 (and FIGS. 4 and 5 (plotted from the Table 2 data)) show that an integrity-enhanced (embedded) thermoelectric device provides performance levels (delta T) similar to, and only slightly lower than, unembedded devices over a wide range of drive power.

FIG. 4 is a graph of performance in delta T against power in watts for integrity-enhanced and unenhanced thermoelectric devices. This figure shows that integrity enhancement results in little, if any, performance reduction (delta T) below about 20 watts, and above about 20 watts the reduction is not substantial (i.e., not more than about 10xC).

FIG. 5 is a graph of performance in delta T versus driven plate temperature for integrity-enhanced and unenhanced thermoelectric devices. Integrity enhancement does not reduce performance over the range of temperatures tested.

EXAMPLE

Preparation

In one embodiment an integrity-enhanced thermoelectric device was prepared by mixing by gentle folding of resin into the balloons taking care to avoid breakage of the balloons and to avoid entraining air. The mixture was 70% epoxy resin (F110) with 30% (by weight) of nitrogen filled glass balloons (MC-37, Emersom & Cuming, Canton, Mass.) of about 45 to 250f diameter. The unembedded thermoelectric device, a BiTe, 16 multicouple device of about 32×32×10 mm in size, was placed in a silicon rubber mold, having a first injection port or sprue and a second port or sprue. Approximately 5 cc of the mixture was then injected into the thermoelectric device through the first port or sprue under a pressure of 5 psi. Injection was continued until excess material exuded from the second port of the silicon rubber mold indicating substantial displacement of all air within the thermocouple and replacement with the mixture of resin and balloons. Filling was to substantially 100% of the void volume of the thermoelectric device. Care was taken not to fracture any connections or dies. Curing was accomplished at 65xF (ambient or room temperature) for 2 hours yielding an integrity-enhanced thermoelectric device.

Evaluation of Integrity

The integrity-enhanced thermoelectric device was tested in the following fashion:

Drop Test: Dropping the device 10 times from a height of 6 feet onto a concrete floor had no adverse effect on its performance.

Thermal Shock Test: The device was driven at maximum power for 220 cycles, a cycle being reaching maximum temperature (Tmax) of about 150xC at one plate and then reversing polarity at full power and reaching the minimum temperature (T min) of about −50xC at that plate. Several sets of 220 cycles were run without observable degeneration of performance or thermal flexing.

Corrosion Test: The device was submerged in 6N ferric chloride ($FeCl_3$), 1N saline, and dilute nitric acid, none of which caused any apparent deterioration or adverse effect on performance.

Acceleration/Random Vibration Test: A module retained by embedding in wax was positioned in a test fixture mounted to a dynamic shock and acceleration tester (Dynatran TM model 3100A) operated at 30 DB/octave for five minutes in three axis random vibration.

The resulting integrity-enhanced thermoelectric device showed (1) no greater than about 10% (and preferably no greater than about 5% and most preferably no greater than about 1%) incidence of function loss (failure) of the device on application to the device of a substantial impact or distortion force or corrosion exposure, and (2) the device had at least about 85% of the thermal performance of thermoelectric device without integrity enhancement (i.e., thermal conductivity across the devices was significantly less than 0.0021 Cal-$Cm/Cm^2$ Sec xC, and was less than or equal to about 0.0015 Cal-$Cm/Cm^2$ Sec xC; empirically expressed as maintenance of at least a 40xC temperature differential over the intra-plate distance which was about 3/16 to about ¼ of an inch).

TABLE 1

(31 couple 9 Amp production unit)

|  | Th | I | V | Tc | delta t |
|---|---|---|---|---|---|
| PRIOR TO EMBEDDING: | 50xC | 9.0 | 3.79 | −16.5 | 66.5xC |
|  | 52 | 8.0 | 3.50 | −17.5 | 69.5 |
|  | 52 | 9.0 | 3.80 | −15.0 | 67.0 |
|  | 52 | 8.0 | 3.46 | 13.7 | 65.7 |
| AFTER EMBEDDING: | 52 | 9.0 | 3.80 | −15.0 | 67.0 |
|  | 52 | 8.0 | 3.46 | 13.7 | 65.7 |

TABLE 2

| Unembedded Device | | | Embedded Device | | |
|---|---|---|---|---|---|
| W (watts) | Tc (xK) | delta T | W (watts) | Tc (xK) | delta T |
| 0.540 | 307.000 | 16.400 | 0.520 | 307.300 | 16.100 |
| 2.060 | 293.700 | 29.700 | 2.020 | 295.300 | 28.100 |
| 4.380 | 283.700 | 39.700 | 4.290 | 286.300 | 37.100 |
| 7.440 | 275.500 | 47.900 | 7.280 | 279.300 | 44.100 |
| 11.200 | 268.400 | 55.000 | 11.050 | 273.300 | 50.100 |
| 15.600 | 262.700 | 60.700 | 15.420 | 268.100 | 55.300 |
| 20.720 | 258.300 | 65.100 | 20.580 | 264.000 | 59.400 |
| 26.480 | 255.000 | 68.400 | 26.320 | 261.100 | 62.300 |
| 29.665 | 253.700 | 69.700 | 29.580 | 260.100 | 63.300 |
| 33.120 | 252.500 | 70.900 | 33.120 | 259.200 | 64.200 |
| 38.670 | 251.900 | 71.500 | 36.670 | 258.700 | 64.700 |
| 40.600 | 251.500 | 71.900 | 40.600 | 258.400 | 65.000 |
| 44.520 | 251.200 | 72.200 | 44.630 | 258.300 | 65.100 |
| 49.060 | 251.300 | 72.100 | 49.170 | 258.600 | 64.800 |
| 53.700 | 251.800 | 71.600 | 53.930 | 259.300 | 64.100 |
| 58.680 | 252.600 | 70.800 | 59.040 | 260.300 | 63.100 |
| 63.625 | 253.500 | 69.900 | 64.250 | 261.600 | 61.800 |
| 69.680 | 255.000 | 68.400 | 70.330 | 263.300 | 60.100 |
| 81.340 | 258.700 | 64.700 | 82.600 | 267.700 | 55.700 |

What is claimed is:

1. An integrity-enhanced thermoelectric device comprising:

a first plate and a second plate spaced apart from each other (opposing plates);

a couple including a p-doped leg and a n-doped leg, and means for electrically interconnecting a first end of said p-doped leg to a first end of said n-doped leg;

means for connecting opposite ends of said p-doped leg and of said n-doped leg to said plates;

said plates comprising ceramic material, and said means for electrically connecting said p-doped leg to said n-doped leg, comprising a metal pad bonded to the surface of the plate defining the interspace, and in electrical connection with a first end of said p-doped leg and a first end of said n-doped leg;

at least two of said couples electrically connected in series and having opposed ends connected to the opposing plate;

said plates and said legs defining an interspace between said plates;

syntactic foam occupying said interspace and in kinematic association with said legs and plates to form an embedded thermoelectric device; and said syntactic foam comprising resin and hollow glass balloons which have about 180 to about 250$\mu$ diameter and comprising at least about 30% by weight of the mixture of balloons and resin, said hollow glass balloons being filled with one of inactive gases or mixtures thereof.

2. The device of claim 1 wherein said inactive gases comprise nitrogen.

3. The device of claim 1 wherein said inactive gases comprise inert gases.

4. The device of claim 3 wherein said inert gases comprise helium, argon or neon.

5. The device of claim 1 wherein said resin comprises urea-formaldehyde.

6. The device of claim 1 wherein said resin comprises epoxy resin.

7. An integrity-enhanced thermoelectric device comprising: a first plate and a second plate spaced apart from each other (opposing plates);

a couple including a p-doped leg and a n-doped leg, and means for electrically interconnecting a first end of said p-doped leg to a first end of said n-doped leg;

means for connecting opposite ends of said p-doped leg and of said n-doped leg to said plates;

at least two of said couples electrically connected in series and having opposed ends connected to said plates;

said plates and said legs defining an interspace between said plates;

syntactic foam occupying said interspace and in kinematic association with said legs and plates to foam an embedded thermoelectric device; and said syntactic foam comprising resin and hollow sintered ceramic microballoons and comprising at least about 30% by weight of the mixture of balloons and resin, said hollow sintered ceramic microballoons being filled with one of inactive gases or mixtures thereof.

8. The device of claim 7 wherein said inactive gases comprise nitrogen.

9. The device of claim 7 wherein said inactive gases comprise inert gases.

10. The device of claim 9 wherein said inert gases comprise helium, argon and neon.

11. The device of claim 7 wherein said resin comprises urea-formaldehyde.

12. The device of claim 7 wherein said resin comprises epoxy resin.

13. The device of claim 7 wherein said sintered ceramic microballoons comprise high alumina ceramic microballoons.

* * * * *